United States Patent [19]

Willoner

[11] 4,232,269
[45] Nov. 4, 1980

[54] DIGITALLY PROGRAMMABLE ACTIVE RC BANDPASS FILTER WITH CONSTANT ABSOLUTE BANDWIDTH

[75] Inventor: Gideon Willoner, North Vancouver, Canada

[73] Assignee: GTE Lenkurt Electric (Canada) Ltd., Burnaby, Canada

[21] Appl. No.: 936,999

[22] Filed: Aug. 25, 1978

[51] Int. Cl.$^2$ .............................................. H03F 1/34
[52] U.S. Cl. ........................................ 330/85; 330/107
[58] Field of Search ................. 330/85, 107, 109, 294, 330/303, 305, 306

[56] References Cited

U.S. PATENT DOCUMENTS

| | | | |
|---|---|---|---|
| 3,747,007 | 7/1973 | Geitner | 330/107 X |
| 4,009,400 | 2/1977 | Harris et al. | 330/107 X |

FOREIGN PATENT DOCUMENTS

| | | | |
|---|---|---|---|
| 438095 | 1/1975 | U.S.S.R. | 330/107 |
| 562913 | 6/1977 | U.S.S.R. | 330/107 |

OTHER PUBLICATIONS

Jenkins, "Active Filter has Separate Band and Frequency Controls", *Electronics*, Sep. 11, 1972, p. 110.
Kaehler, "Periodic-Switched Filter Networks-A Means of Amplifying and Varying Transfer Functions", *IEEE Journal of Solid-State Circuits*, Aug. 1969, pp. 225-230.
Bruton et al., "Tunable RC-Active Filters Using Periodically Switched Conductances", *IEEE Transactions on Circuit Theory*, vol. CT-20, No. 3, May 1973, pp. 294-301.

*Primary Examiner*—James B. Mullins
*Attorney, Agent, or Firm*—Leonard R. Cool

[57] ABSTRACT

A narrow-band RC active bandpass filter, in which the center frequency may be changed by changing the resistance values of certain resistive elements, has the certain resistive elements switchably connectable into and out of the RC network so that the ratio of time during which the resistors are connected to the network to the time during which resistors are not connected to the network determines the effective resistance thereof. A programmable timing circuit has a plurality of outputs with each output supplying a different number of equal width pulses during a predetermined like time period whereby each output corresponds to a different ratio. The timing circuit actuates and deactuates the switchable connection from a selected output thus deriving the required effective resistance for a predetermined center frequency. The bandwidth of the passband is set by a different resistive element and remains substantially unchanged as the center frequency is changed by changing the effective resistance of the certain resistive elements.

2 Claims, 1 Drawing Figure

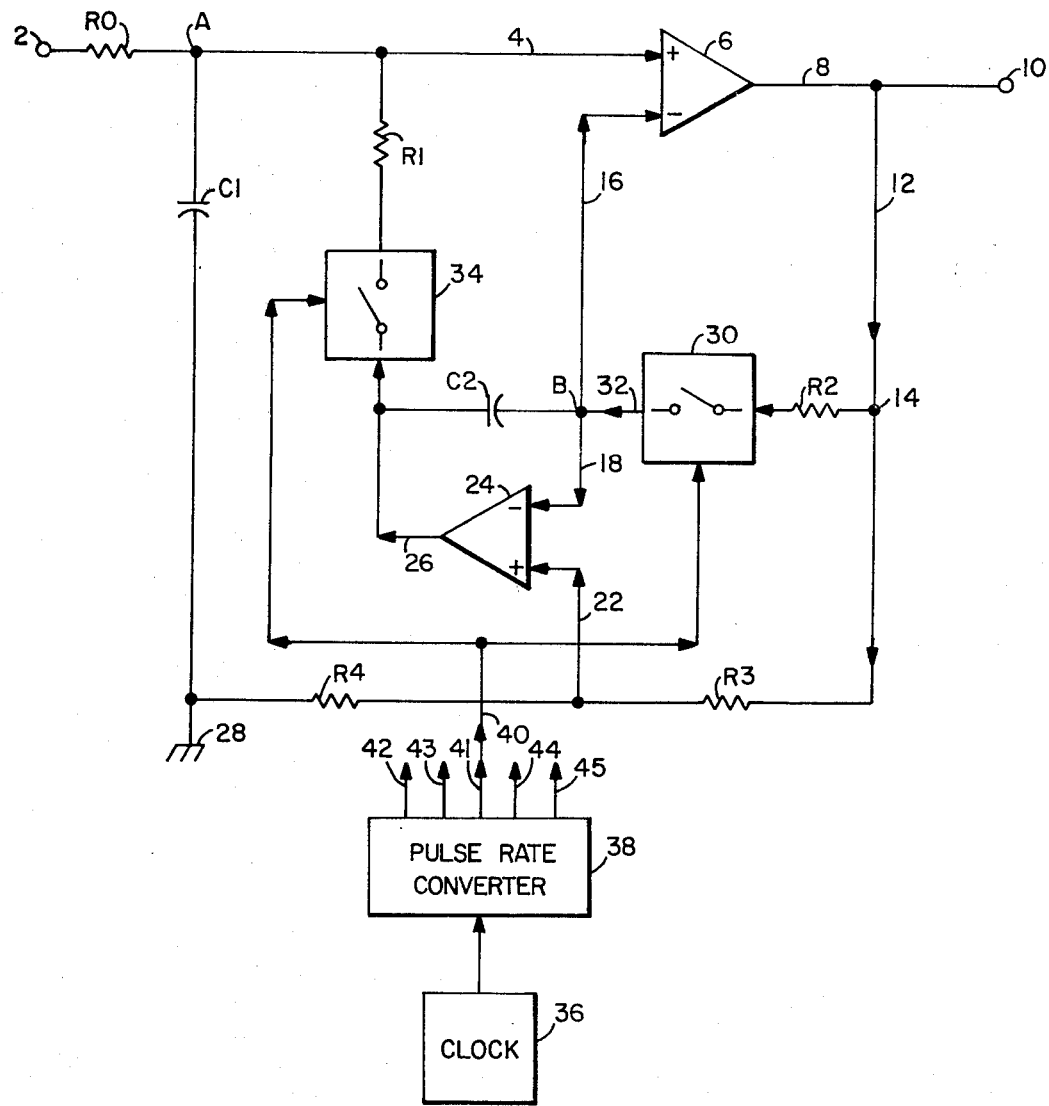

DIGITALLY PROGRAMMABLE ACTIVE RC BANDPASS FILTER WITH CONSTANT ABSOLUTE BANDWIDTH

BACKGROUND OF THE INVENTION

1. Field of the Invention

This invention relates to narrow-band RC active bandpass filters and in particular to narrow-band filters in which the absolute bandwidth is substantially constant and is substantially independent of the center frequency.

2. Description of the Prior Art

In keeping with the size reduction in components, it has been necessary to devise new techniques to obtain filter networks of comparable reduced size. Thus, inductor simulation has been refined and the use of RC networks with operational amplifiers to obtain bandpass, low-pass, and bandstop filters is well known. A problem that was created by the use of miniature and integrated circuits was that of obtaining high resistance values in excess of the values of resistance available in such circuits. One way in which this problem was solved was to switch resistors in and out of the circuit. In this way, the effective resistance is increased well beyond the actual values available and in direct proportion to the ratio of the off-period to the on-period (resistor connected in the circuit).

Using this technique, filters reduced in size but which approximate the characteristics of the prior conventional large size filters were derived as well as reduced size filters which permit the scaling of transfer functions, N-path multiplex filters and digital filters. However, none of the reduced size filters can be used as a narrow-bandpass filter in which the center frequency may be changed by digital programming and in which the absolute bandwidth remains substantially constant.

SUMMARY OF THE INVENTION

A tunable narrow-band bandpass filter wherein the bandwidth of the passband remains substantially constant as the center frequency is changed includes an RC active network having a first resistive element, the resistance value of which sets the bandwidth of the filter. Certain other resistive elements are switchably connectable into and out of the RC network, and a switching device is interposed in said RC network to effect a connection of these certain resistive elements to the RC network when said switching device is actuated and to break this said connection when the device is deactuated. A programmable timing means provides a plurality of timed outputs for different selective connection to said switching device. Each timed output has a like fixed period, T, but sets a different fraction of the fixed time period during which the switch means is actuated. Thus, the different outputs yield different ratios, i.e., off-period to on-period, to selectively vary the effective value of the certain resistive elements and to vary the center frequency accordingly.

BRIEF DESCRIPTION OF THE DRAWING

The single FIGURE presented is a schematic diagram of a preferred embodiment of applicant's programmably tunable narrow-band bandpass filter having a predetermined absolute passband.

DETAILED DESCRIPTION OF THE INVENTION

Referring to FIG. 1, the signal is applied between input 2 and ground 28. As will be shown herein below, the resistance value of resistor R0 determines the absolute bandwidth. Resistor R0 has one end connected to input terminal 2 and the other end connected to junction A which is connected along path 4 to the non-inverting input of operational amplifier 6.

The feedback network of operational amplifier 6 consists of resistor R2 having one end thereof connected to the output of amplifier 6 via path 8, path 12 and junction 14. The other end of R2 is connected to one side of switch 30 which has the other side thereof connected via paths 32 and 16 to the inverting input of operational amplifier 6, to one end of capacitor C2, and to the inverting input of operational amplifier 24. Thus, resistor R2 is switchably connectable in the feedback network of operational amplifier 6; and, as will be shown herein below, the resistance value of resistor R2, in conjunction with R1, C1 and C2, is used in setting the center frequency of the bandpass filter. The output of operational amplifier 24 is connected to one side of switch 34 which is connected to one end of resistor R1, the other end of resistor R1 being connected to path 4 and the non-inverting input to operational amplifier 6. Thus, resistor R1 is switchably connectable in the feedback network of operational amplifier 6 and operates in conjunction with R2 and capacitors C1 and C2 to set the center frequency of the network as the effective resistance of each of these two resistors is changed. Operational amplifier 24 has its non-inverting input connected with path 22 to the junction of resistors R3 and R4. The value of resistors R3 and R4 are not critical but in the normal application, they are equal and are selected to provide a gain of 2 for amplifier 24.

Switches 30 and 34 are preferably semiconductor switches or gating circuits which are operated by pulses from a binary pulse train, and are connected via path 40 to pulse rate converter 38. While a specific connection to output 41 of pulse rate converter 38 is shown, it should be understood that lead 40 may be connected to any other output lead 42-45, or to any combination thereof, depending upon the ratio of off-period to on-period desired. As is well known, the effective resistance varies in direct relation to this ratio. Thus, the minimum value of resistance is obtained when the resistor is permanently connected in the circuit and the effective value increases as the on-period is decreased.

From practical considerations such as the effect of transients and the accuracy of the center frequency, the clock frequency of clock 36 should be chosen to be of two orders of magnitudes (100 times) greater than the highest center frequency contemplated. For example, if the highest center frequency is 10,000 H$_z$, the clock frequency should be $fc = 100 \times 10,000 = 1$ mH$_z$. The clock frequency is divided in pulse rate converter 38 so as to obtain various ratios of on-period to off-period.

One method of doing this is to use a binary rate multiplier. A first step here is to determine the minimum on-period, and it is preferable if this value is compatible with binary techniques. For example, the minimum on time could be taken as 1/32. A duty cycle would then be the time period for 32 pulses. The binary rate multiplier could then include well known logic circuits to provide 16, 8, 4, 2 and 1 output pulses during the duty cycle. By proper connection of the outputs of the logic circuits, the equivalent of 31 pairs of resistances could be obtained which in turn would tune the filter to 31 different center frequencies.

It is apparent from the foregoing discussion that such an arrangement could most efficiently be used in a multichannel data system employing relatively low baud rates. A major advantage of such an arrangement is that only one filter design is required for a plurality of filters. This facilitates interchangeability and considerably simplifies manufacturing of the filters.

A filter using the configuration shown in the drawing was built in which the relative bandwidth, $\delta$, is related to RO as follows:

$$RO = \sqrt{3/2\delta} \quad (1)$$

and the center frequency was determined by $$Wo = 1/RC \quad (2)$$

The filter characteristics and element values were:
center frequency selected = 500 $H_z$
$C1 = C2 = C$ 10 $\mu F$
$R1 = R2 = R = 31.8$ k$\omega$*
bandwidth = 100 $H_z$
$\delta = 100/500 = 0.2$
$RO = 134$ k$\omega$*
*Standard values were used, i.e., $R = 31.6$ k$\omega$ and $RO = 133$ k$\omega$.

Further, changing the value of resistors R1 and R2 changed the center frequency but the bandwidth remained constant.

While the invention has been particularly shown and described with reference to a preferred embodiment thereof, it will be understood by those skilled in the art that change in form and detail may be made therein without departing from the spirit and scope of the invention.

What is claimed is:

1. A tunable narrow-band bandpass filter in which the absolute bandwidth and the center frequency can be controlled independently comprises:
   a 3-terminal RC active network in which a ground terminal provides one connection to both the input and the output ports, a first terminal provides the ungrounded connection to the input port, and a second terminal provides the ungrounded connection to the output port, said RC active network comprising:
   a first resistor having one terminal end thereof connected to said first terminal of the input port, said first resistor establishing the bandwidth in accordance with the relationship $\delta = \sqrt{3}/2RO$, where $\delta$ is the relative bandwidth, and RO is the value of the first resistor;
   a first operational amplifier having the non-inverting input terminal connected to the other terminal end of said first resistor, having an inverting input terminal and having an output terminal connected to the second terminal of said active network;
   a first capacitor having one terminal end connected to the other terminal end of said first resistor and having the other terminal end connected to said ground terminal;
   a feedback network including certain resistive elements the resistance value of which set the center frequency of the filter in accordance with the relationship $Wo = 1/RC$, where $Wo = 2\pi fo$, and fo is the center frequency, R is the value of the resistance of the resistor and C is the value of the capacitor in the network; said feedback network having an input terminal connected to the output terminal of said first operational amplifier, having a first output terminal connected to the inverting input terminal of said first operational amplifier and having a second output terminal connected to the non-inverting input of said first operational amplifier; and
   switch means interposed in said feedback network to effect a connection between said resistive elements and said first and second output terminals of the feedback network when said switch means is actuated and opening said connection otherwise; and
   programmable timing means providing a plurality of timed outputs for selective connection to said switch means, each timed output setting a predetermined time period during which said switch means is actuated and thereby selectively varying the effective value of the certain resistive elements so that the center frequency of the filter may be programmably changed.

2. A filter as set forth in claim 1 wherein said feedback network further comprises:
   a second operational amplifier having non-inverting and inverting input terminals and an output terminal;
   a second resistor having one terminal end thereof connected to the input terminal of said feedback network;
   a first switching device having one terminal thereof connected to the other terminal end of said second resistor, having a second terminal thereof connected to the non-inverting input of said second operational amplifier and to said first output terminal of said feedback network, and having a third terminal connected to the output of said programmable timing means, whereby the effective value of the resistance of the second resistor may be varied;
   a second capacitor having one terminal end thereof connected to the inverting input and the other terminal end connected to the output of said second operational amplifier;
   a third resistor having one terminal end connected to the second output terminal of said feedback network;
   a second switching device having one terminal connected to the output of said second operational amplifier, having a second terminal connected to the other terminal end of said third resistor, and having a third terminal connected to the output of said programmable timing means, whereby the effective resistance of the third resistor may be varied the same as the second resistor is varied.

* * * * *

UNITED STATES PATENT AND TRADEMARK OFFICE
CERTIFICATE OF CORRECTION

PATENT NO. : 4,232,269
DATED : November 4, 1980
INVENTOR(S) : Gideon Willoner

It is certified that error appears in the above-identified patent and that said Letters Patent are hereby corrected as shown below:

Column 3, lines 24, 27 and 28: Lower case OMEGA symbol should be upper case OMEGA symbol.

Signed and Sealed this

Twenty-first Day of April 1981

[SEAL]

Attest:

RENE D. TEGTMEYER

*Attesting Officer*   *Acting Commissioner of Patents and Trademarks*